(12) United States Patent
Butzmann

(10) Patent No.: US 9,846,198 B2
(45) Date of Patent: Dec. 19, 2017

(54) BATTERY MANAGEMENT SYSTEM, BATTERY, MOTOR VEHICLE HAVING A BATTERY MANAGEMENT SYSTEM, AND METHOD FOR MONITORING A BATTERY

(75) Inventor: Stefan Butzmann, Beilstein (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 774 days.

(21) Appl. No.: 14/345,250

(22) PCT Filed: Sep. 7, 2012

(86) PCT No.: PCT/EP2012/067477
§ 371 (c)(1),
(2), (4) Date: Oct. 2, 2014

(87) PCT Pub. No.: WO2013/041386
PCT Pub. Date: Mar. 28, 2013

(65) Prior Publication Data
US 2015/0028879 A1    Jan. 29, 2015

(30) Foreign Application Priority Data
Sep. 19, 2011 (DE) .................... 10 2011 082 937

(51) Int. Cl.
*H02J 7/00* (2006.01)
*H02J 7/14* (2006.01)
(Continued)

(52) U.S. Cl.
CPC ....... *G01R 31/362* (2013.01); *G01R 31/3624* (2013.01); *G01R 31/3679* (2013.01);
(Continued)

(58) Field of Classification Search
USPC ....... 320/116, 107, 118, 119, 122, 134, 137; 324/434, 426, 433, 427
See application file for complete search history.

(56) References Cited

U.S. PATENT DOCUMENTS 6,781,343 B1    8/2004  Demachi et al.
8,022,669 B2 *  9/2011  Li .................... H02J 7/0021
                                                        320/122
(Continued)

FOREIGN PATENT DOCUMENTS

DE    10 2009 046 567 A1    5/2011
EP        2 148 384 A1       1/2010
(Continued)

OTHER PUBLICATIONS

International Search Report corresponding to PCT Application No. PCT/EP2012/067477, dated Dec. 14, 2012 (German and English language document) (5 pages).

*Primary Examiner* — Alexis Pacheco
(74) *Attorney, Agent, or Firm* — Maginot, Moore & Beck LLP

(57) ABSTRACT

A battery management system includes a control unit having a first micro controller arranged on the low-voltage side of the control unit, and a second micro controller arranged on the high-voltage side of the control unit. The system further includes a plurality of first voltage measuring units respectively assigned to a battery module of the battery, and a first communication connection for transmitting voltage values from the first voltage measuring units to the first micro controller. The system also has a plurality of second voltage measuring units and a second communication connection for transmitting voltage values from the second voltage measuring units to the second micro controller. The first or the second voltage measuring units are configured as min/max measuring units such that they detect a minimum and a maximum voltage value of the battery cells in the battery modules, and dismiss voltage measurement values in between.

12 Claims, 5 Drawing Sheets

(51) Int. Cl.
*G01R 31/36* (2006.01)
*H01M 10/42* (2006.01)
*H01M 10/48* (2006.01)
*H04Q 9/00* (2006.01)
*H01M 10/0525* (2010.01)

(52) U.S. Cl.
CPC ....... H01M 10/425 (2013.01); H01M 10/482 (2013.01); H04Q 9/00 (2013.01); *G01R 31/3658* (2013.01); *H01M 10/0525* (2013.01); *H01M 10/486* (2013.01); *H01M 2010/4271* (2013.01); *H01M 2220/20* (2013.01); *H04Q 2209/845* (2013.01); *Y02E 60/122* (2013.01)

(56) References Cited

U.S. PATENT DOCUMENTS

| | | | | |
|---|---|---|---|---|
| 8,421,413 | B2* | 4/2013 | Mizoguchi | G01R 31/3658 320/119 |
| 2003/0044689 | A1* | 3/2003 | Miyazaki | H02J 7/0026 429/320 |
| 2004/0125618 | A1* | 7/2004 | De Rooij | H02J 1/102 363/17 |
| 2008/0180106 | A1* | 7/2008 | Gorbold | G01R 31/3658 324/434 |
| 2010/0079146 | A1* | 4/2010 | Kurose | B60L 3/0046 324/433 |
| 2010/0185405 | A1 | 7/2010 | Aoshima et al. | |
| 2011/0050237 | A1* | 3/2011 | Sekizaki | G01R 31/3658 324/434 |
| 2011/0080138 | A1* | 4/2011 | Nakanishi | H02J 7/0016 320/116 |
| 2012/0282500 | A1* | 11/2012 | Tzivanopoulos | G01R 31/3658 429/61 |
| 2013/0002016 | A1* | 1/2013 | Furukawa | H01M 10/425 307/9.1 |

FOREIGN PATENT DOCUMENTS

| | | |
|---|---|---|
| EP | 2 330 431 A1 | 6/2011 |
| WO | 2013/010831 A1 | 1/2013 |
| WO | 2013/010832 A2 | 1/2013 |

* cited by examiner

_BATTERY MANAGEMENT SYSTEM, BATTERY, MOTOR VEHICLE HAVING A BATTERY MANAGEMENT SYSTEM, AND METHOD FOR MONITORING A BATTERY_

This application is a 35 U.S.C. §371 National Stage Application of PCT/EP2012/067477, filed on Sep. 7, 2012, which claims the benefit of priority to Serial No. DE 10 2011 082 937.7, filed on Sep. 19, 2011 in Germany, the disclosures of which are incorporated herein by reference in their entirety.

BACKGROUND

The present disclosure relates to a battery management system, a battery comprising a battery management system, a motor vehicle comprising the battery management system and a method for monitoring a battery. In particular, the disclosure relates to a battery management system and an associated method for determining and evaluating at least one measured variable from at least one battery module.

It appears that in future new battery systems will increasingly be used both in stationary applications, such as, for example, wind turbines, in vehicles, such as, for example, in hybrid and electric vehicles, and in the consumer sector, such as, for example, in laptops and mobile telephones, and very stringent requirements in respect of the reliability, safety, performance and life of said battery systems will be imposed on these systems.

In particular batteries using lithium-ion technology are suitable for such applications. They are characterized, inter alia, by a high energy density and a low level of self-discharge. By definition, lithium-ion batteries comprise two or more lithium-ion cells which are connected to one another. Lithium-ion cells can be connected to one another by being connected in parallel or in series to form modules and then to form batteries. Typically, a module comprises six or more cells.

DE 10 2009 046 567 A1 discloses a battery which is constructed from a plurality of battery modules, wherein the battery modules are monitored by means of a central battery management system.

As illustrated in FIG. 1, a conventional battery system 10 can have a battery management system 11 comprising a central control device 15, which communicates with a plurality of cell monitoring units 16 ("cell supervision circuit"; CSC), which are each assigned to a plurality of battery cells 14 or battery modules. In the text which follows, depending on the context, all of the battery cells 14 arranged in the battery modules with or without the associated battery management system 11 can be referred to as battery. The battery cells 14 are grouped into battery modules, wherein the precise division of the battery cells into the battery modules is not shown in FIG. 1. The battery management system 11 can be accommodated with battery cells 14 or battery modules in a common housing (not shown). The battery modules can each have a dedicated housing. Improved scalability can be achieved by means of an arrangement of the battery cells 14 in battery modules. In order to monitor correct functioning of the battery cells 14, the battery cells are monitored by the plurality of CSCs 16. In this case, typically a CSC 16 has in each case two battery modules assigned to it. A CSC 16 contains measurement electronics, which monitor the voltage and further parameters. The information obtained by means of the CSC 16 is transmitted via a communication bus 18, for example a CAN bus, to a central control device 15, which evaluates the data from all of the battery cells 14 and, in the event of discrepancies in respect of defined parameters, intervenes with corrections and, if necessary, opens the contactors 17, 19 and disconnects the battery system 10.

The control device 15 has a low-voltage side or a part 22 on the low-voltage side comprising a microcontroller 23 and a high-voltage side or a part 24 on the high-voltage side comprising a microcontroller 25. The low-voltage side 22 and the high-voltage side 24 are connected to one another via galvanic isolation 29. The low-voltage side 22 is connected to a Hall sensor 27 for measuring the battery current, wherein the high-voltage side 24 is connected to a shunt 26 for measuring the battery current. The control device 15 communicates with the vehicle electronics by means of the bus 28. The electrical terminals 12, 13 are used for supplying energy for example for a motor vehicle and/or for recharging the battery.

A further topology for cell monitoring is illustrated in FIG. 2. In this case, the CSCs 16 transmit their information via a daisy chain 32. A CSC 16 in this case directs its data packet to the next CSC, which adds its information and in turn passes this on to the next CSC 16. A cell voltage measuring unit 21 (CVM) is arranged in each CSC 16. The string of CSCs 16 arranged with daisy chain topology is in turn connected to the control device 15.

The monitoring of the cell voltages and the currents and the temperature in respect of specific limit values being overshot or undershot is an essential safety factor in a battery system. ISO standards, in particular ISO 26262: Functional Safety of E/E Systems in Motor Vehicles, require that a certain level of safety ASIL ("Automotive Safety Integrity Level") is achieved.

In order to ensure sufficient functional safety for the battery system 10, the data from the CSCs 16 are evaluated and compared with one another both on the high-voltage side 24 and on the low-voltage side 22 of the control device 15 in the two redundant microcontrollers 23, 25. The microcontroller 25 on the high-voltage side in this case uses the total voltage of the pack, i.e. all of the battery modules and the total current which is measured by means of the shunt 26, for example. The microcontroller 23 on the low-voltage side measures the voltage of the individual battery cells 14 and the current which is determined via the Hall sensor 27, for example.

The current and voltage need to be interrogated at the same time in order to be able to compute plausible values. In order to be able to compare the values on the high-voltage side 24 and the low-voltage side 22, these data also need to be determined in parallel. In order to obtain a synchronous database, therefore, interrogations are sent by the control device 15 at the same time via the communication bus 18 to the CSCs 16, Hall sensors 27 and the shunt 26, which then ideally signal back simultaneously. In order to meet a high ASIL, the control device also has numerous safety and control functions which include, inter alia, self-monitoring of the control device 15. In addition, the control device monitors the CSCs 16, wherein the data both for the microcontroller 25 on the high-voltage side and for the microcontroller 23 on the low-voltage side are detected by the same CSCs 16.

The known battery management systems have the disadvantage that the control device needs to be programmed, involving a high level of complexity, in order to be able to calculate the plausibility of the CSC data and thus to ensure the required functional safety and to compensate for deficiencies in the often only relatively simple data detection. For this purpose, often very complex computation models need to be used. The data, as already illustrated, are typically recorded using a CAN bus-based or daisy chain-based topology. With the known topologies for monitoring battery cells, a high level of functional safety and therefore a high ASIL therefore require a considerable level of complexity in terms of software. In addition to the high computation complexity involved, the communication bus, preferably a CAN bus, is loaded with many data to be transmitted, with the result that it reaches its capacity limits.

SUMMARY

The disclosure provides a battery management system and an associated method.

According to the disclosure, a battery management system comprises a control device having a first microcontroller arranged on a low-voltage side of the control device and a second microcontroller arranged on a high-voltage side of the control device, and a plurality of first voltage measuring units, which are each assigned to at least one battery module of the battery, a first communication link for transmitting voltage values from the first voltage measuring units to the first microcontroller, a plurality of second voltage measuring units and a second communication link for transmitting voltage values from the second voltage measuring units to the second microcontroller. The first or second voltage measuring units are in the form of min/max measuring units in order to detect a minimum and a maximum voltage value of the battery cells in the battery modules assigned to the respective min/max measuring unit and to reject voltage measured values therebetween.

The method according to the disclosure for monitoring a battery in principle comprises the following steps: detecting voltage values for determining the state of charge of battery cells or battery modules by means of a first communication topology; detecting voltage values by means of a second communication topology which is independent of the first communication topology and using min/max measuring units for monitoring maintenance of a maximum and a minimum voltage.

With the battery management system according to the disclosure, a topology is advantageously provided whereby the required software complexity and the data rate in the communication bus are reduced and, at the same time, a high ASIL is achieved.

This is achieved in particular by the redundant design according to the disclosure of the component parts, in combination with the use according to the disclosure of min/max measuring units within a string of voltage measuring units. Since, at least on one side, the measuring units for voltage detection are used which each only transmit the minimum and maximum voltage of the cells, now only two cell voltages per battery module are transmitted to the microcontroller on the low-voltage side, for example, and therefore the data transfer on the communication bus is considerably reduced. This is also advantageous, inter alia, in the case of a CAN bus, which is generally used for numerous components in a motor vehicle, for example, for data interchange. In addition, calculations in the receiving microcontroller are simplified since now only two values need to be evaluated.

A redundant design of the battery management system is achieved with comparatively low costs, inter alia since inexpensive min/max measuring units are advantageously used as part of the monitoring topology according to the disclosure.

Advantageous developments of the disclosure are specified in the dependent claims and described in the description.

In accordance with one exemplary embodiment, the first voltage measuring units are connected by means of the first communication link in accordance with a first communication topology and the second voltage measuring units are connected by means of the second communication link in accordance with a second communication topology, which is different than the first communication topology.

Since in this exemplary embodiment advantageously two different topologies are used, the functional safety is thus further increased.

Preferably, a parallel use of a CAN bus-based topology and a daisy chain topology is used. Advantageously, the first communication topology can comprise a daisy chain arrangement, while the second communication topology comprises a CAN bus link, or vice versa.

In accordance with an advantageous development of the disclosure, the battery management system is designed in such a way that the first and second microcontrollers operate independently of one another.

Thus, redundancies are achieved simultaneously both in the CSCs, the communication bus and also in the microcontroller in the control device. In this case, owing to the independent configuration, conditions where synchronization between the microcontroller on the high-voltage side and the microcontroller on the low-voltage side is no longer necessary or only necessary to a minimal extent are still favored in particular. The complexity of the programming of the control device can thus be reduced further.

In accordance with one exemplary embodiment of the disclosure, the first microcontroller on the low-voltage side is connected to a first current sensor, in particular a Hall sensor, wherein the second microcontroller on the high-voltage side is connected to a second current sensor which is different than the first current sensor, in particular a current sensor having a shunt resistor.

In this advantageous embodiment, furthermore the functional safety is increased by virtue of various current measurement systems being combined with the CSC strings according to the disclosure.

In accordance with another exemplary embodiment, the first microcontroller on the low-voltage side is deigned to evaluate electrical voltages and furthermore has a safety function, and the second microcontroller on the high-voltage side is designed to determine a state of charge (SOC).

In this exemplary embodiment, particularly advantageously optimized division is achieved, which combines a high level of functionality with at the same time a high safety level.

In accordance with another advantageous development of the disclosure, both the first and the second measuring units are in the form of min/max measuring units.

As a result, further savings can be made in respect of costs and calculations.

In accordance with an exemplary embodiment of the disclosure, the battery management system comprises a plurality of cell monitoring units, in which in each case one of the first voltage measuring units and one of the second voltage measuring units and an additional microcontroller are arranged, wherein the voltage measuring units of one cell monitoring unit are coupled to common inputs of the cell monitoring unit, and wherein the microcontroller in the cell monitoring unit is designed to evaluate data from one of the voltage measuring units of the respective cell monitoring unit.

In this exemplary embodiment, the microcontroller in one cell monitoring unit can advantageously provide further evaluation and safety functions. At the same time, by virtue of the particular selection of the configuration with cell monitoring units, the scalability of the system is favored.

In addition, in accordance with the disclosure, a battery comprising a battery management system is provided.

In accordance with a preferred exemplary embodiment, the battery is a lithium-ion battery.

In addition, a motor vehicle comprising the battery management system according to the disclosure is provided, wherein the battery to be monitored is connected to a drive system of the motor vehicle.

BRIEF DESCRIPTION OF THE DRAWINGS

Exemplary embodiments of the disclosure will be explained in more detail with reference to the drawings and the description below. In the drawings.

DETAILED DESCRIPTION

Figure 3:
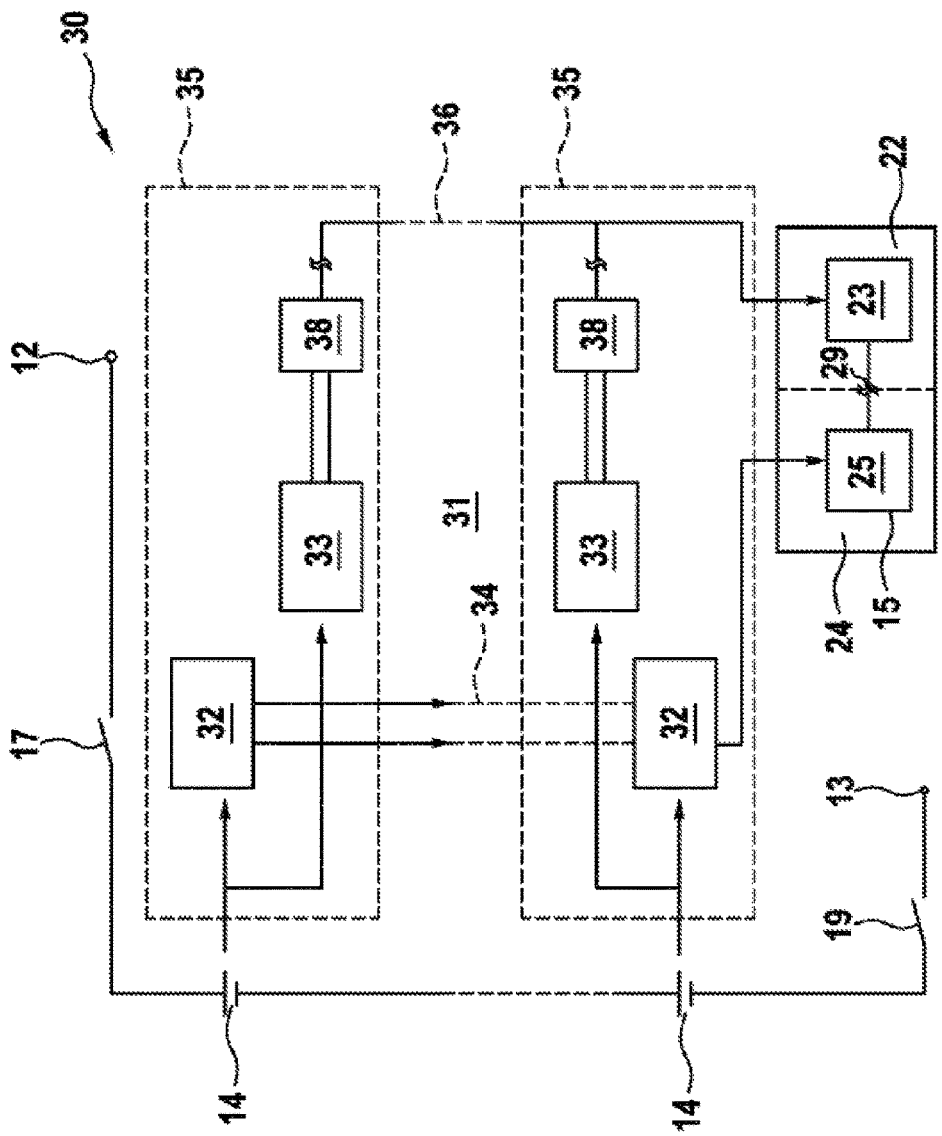
FIG. 3 shows a battery comprising a battery management system for monitoring battery cells of the battery in accordance with an exemplary embodiment of the disclosure, comprising min/max measuring units on the low-voltage side.

FIG. 3 shows a battery comprising a battery management system 31 for monitoring battery cells 14 of the battery in accordance with an exemplary embodiment of the disclosure, wherein, on the low-voltage side of the battery management system, 31, min/max measuring units 33 are arranged. In this case, for the configuration of the battery management system 11, measuring units 33 which only signal the minimum and the maximum voltage of all allocated cells to the control device are used. In this case, these min/max measuring units 33 compare the state of an allocated battery cell 14 with the state of the upstream cell 14. Thus, when determining the maximum voltage of all of the battery cells 14, the higher voltage of the two battery cells 14 can be transmitted to the next measuring unit 33, where it is again compared with the cell 14. At the end, the last measuring unit only communicates the highest voltage value to the control device. Similarly, the minimum voltage of all of the cells 14 is also determined. As is indicated in FIG. 3, a min/max measuring unit in each case communicates two values to a cell monitoring microcontroller 38, which evaluates the two values and transmits the result via the CAN bus 36.

The string on the high-voltage side is provided with voltage measuring units 32. In accordance with a variant according to the disclosure of this exemplary embodiment, the voltage measuring units are in the form of voltage monitoring units CVM (Cell Voltage Monitoring). The CVMs can additionally monitor other physical variables such as, for example, the temperature of the assigned battery modules.

There are advantageously two cell voltage measuring units 32, 33 which act independently of one another in a CSC. A string of cell voltage measuring units 32 supplies power to the microcontroller 25 on the high-voltage side in the control device 15, while the other string supplies power, in parallel to the microcontroller 23 on the low-voltage side. Two different types of buses 34, 36 or communication topologies are used in parallel. Thus, communication can be performed via a daisy chain on one side of the control device 15, for example on the high-voltage side 24, while on the other side communication takes place via a CAN bus. However, the disclosure is not restricted to specific types of communication buses.

Since the string on the low-voltage side for monitoring the voltage is equipped with min/max measuring units 33, increased redundancy is provided in a simple and inexpensive manner. In addition, in this case sufficient functional safety is achieved in which it is unimportant what the precise voltage of the battery cells 14 is. It is primarily relevant to maintain defined upper and lower limits for cell voltages which are identified by the min/max measuring units 33. In addition, the voltage values of the battery cells 14 need to be close to one another, which is typically also the case and which is also identified by the min/max measuring units 33. As soon as these values move apart from one another to a critical extent, there is a fault, which ultimately results in disconnection of the battery system 10.

Figure 1:
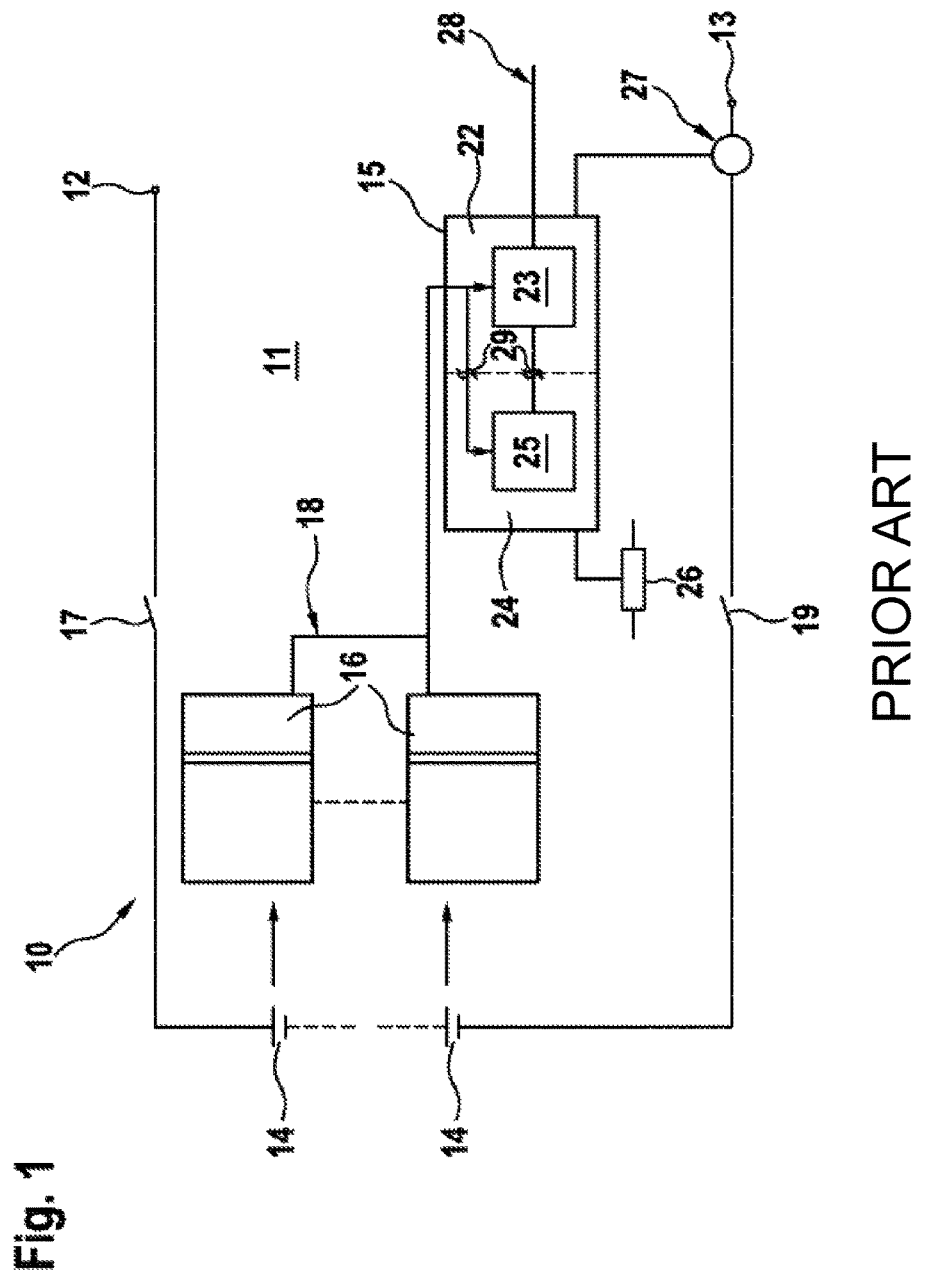
FIG. 1 shows a battery comprising a battery management system in accordance with the prior art.
Figure 2:
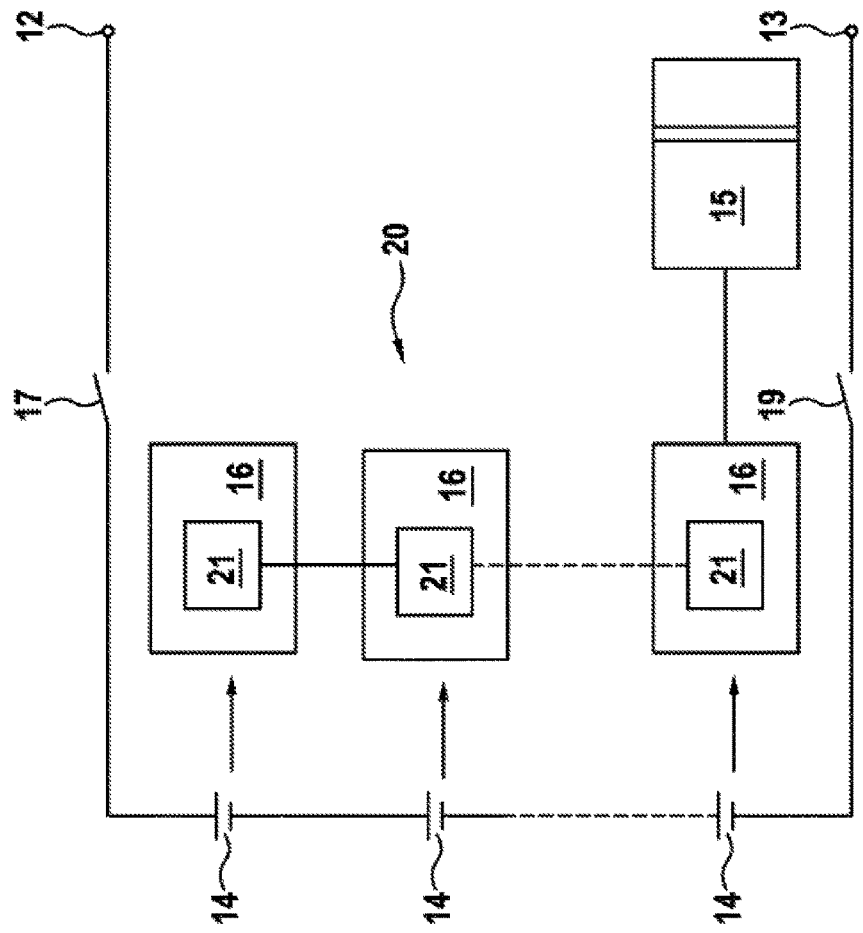
FIG. 2 shows a known daisy chain topology.

In the exemplary embodiment shown in FIG. 1, the calculation of the SOC is performed by the high-voltage side 24, and the low-voltage side 22 performs the safety function. The high-voltage side 24 operates independently of the low-voltage side 22. By virtue of the redundant design of the CSCs 35, a high level of functional safety and therefore a higher ASIL can be achieved, without the control device 15 needing to implement complex fault possibility calculations for this purpose.

Figure 4:
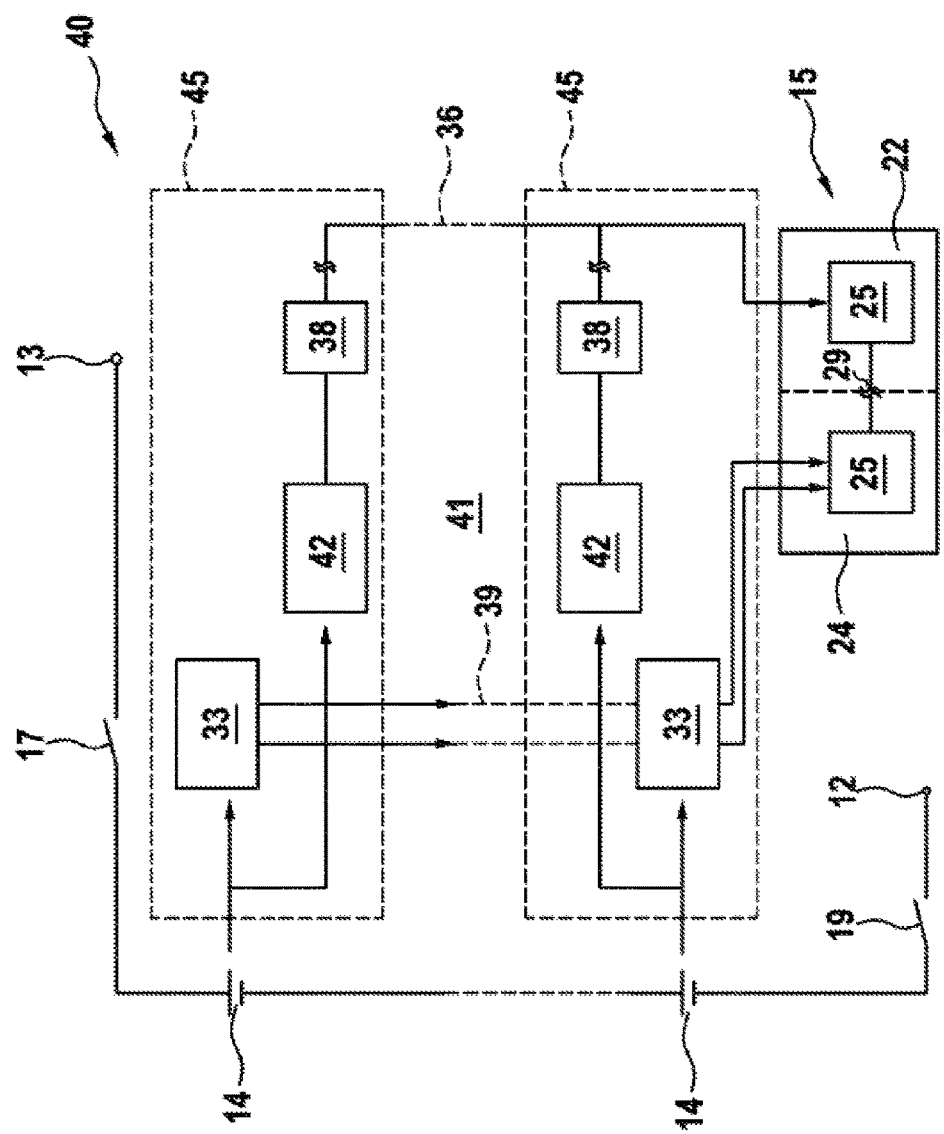
FIG. 4 shows a battery comprising a battery management system for monitoring battery cells of the battery in accordance with another exemplary embodiment of the disclosure, comprising min/max measuring units on the high-voltage side.

FIG. 4 shows a battery comprising a battery management system 41 for monitoring battery cells 14 of the battery in accordance with another exemplary embodiment. In contrast to the exemplary embodiment shown in FIG. 3, the min/max measuring units are in this case arranged on the high-voltage side, i.e. in the string of measuring units which is connected to the microcontroller 25 on the high-voltage side. The string on the high-voltage side is used for monitoring the voltage.

Figure 5:
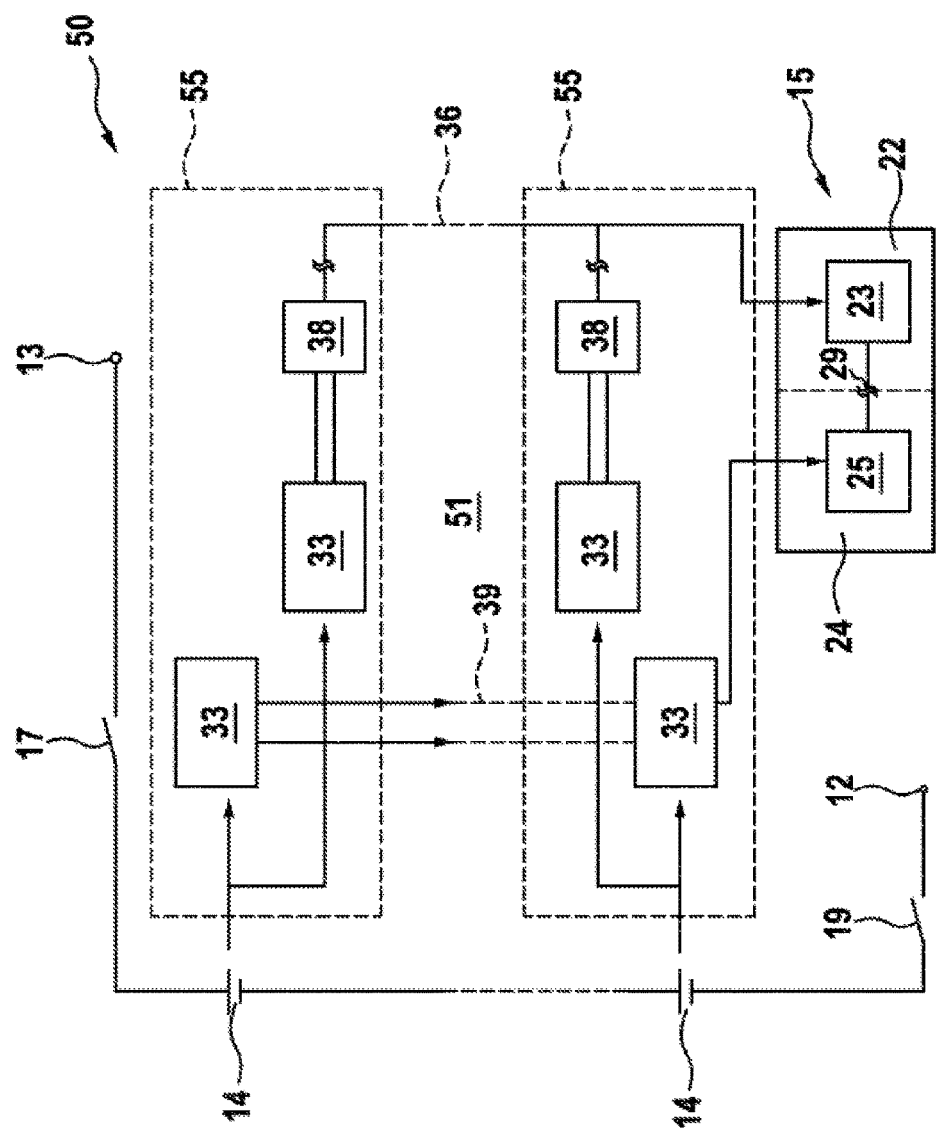
FIG. 5 shows a battery comprising a battery management system for monitoring battery cells of the battery in accordance with yet another exemplary embodiment of the disclosure, comprising min/max measuring units on the low-voltage side and on the high-voltage side.

Alternatively, the two measuring units, i.e. both the measuring units on the high-voltage side and on the low-voltage side, can be replaced by min/max measuring units 33, as shown in FIG. 5. As a result, further savings can be made in terms of cost and calculations. The calculation of the SOC would be less precise only to a minimum extent since the cell voltages are close to one another. Therefore, a mean value is sufficient for the calculation. As soon as the cell voltages move apart from one another, there is in any case a fault which results in disconnection of the system. The SOC then no longer plays a role.

A person skilled in the art will be aware that numerous variations and modifications can be implemented with the present disclosure without departing from the scope of the claims. It should be noted that the disclosure is preferably used for lithium-ion batteries. However, the disclosure can also advantageously be applied to other types of batteries instead.

The invention claimed is:

1. A battery management system, comprising:
a control device having a first microcontroller arranged on a low-voltage side of the control device and a second microcontroller arranged on a high-voltage side of the control device;
a plurality of first voltage measuring units, each of the first voltage measuring units assigned to at least one battery module of the battery;
a first communication link configured to transmit voltage values from the first voltage measuring units to the first microcontroller;
a plurality of second voltage measuring units; and
a second communication link configured to transmit voltage values from the second voltage measuring units to the second microcontroller,
wherein the first or the second voltage measuring units are configured as min/max measuring units in order to detect a minimum and a maximum voltage value of the battery cells in the battery modules assigned to the respective min/max measuring unit and to reject voltage measured values therebetween.

2. The battery management system as claimed in claim 1, wherein the first voltage measuring units are connected by the first communication link in accordance with a first communication topology and the second voltage measuring units are connected by the second communication link in accordance with a second communication topology that is different than the first communication topology.

3. The battery management system as claimed in claim 2, wherein the first communication topology comprises a daisy chain arrangement and the second communication topology comprises a CAN bus link, or wherein the first communication topology comprises the CAN bus link and the second communication topology comprises the daisy chain arrangement.

4. The battery management system as claimed in claim 1, wherein the battery management system is configured such that the first and the second microcontrollers operate independently of one another.

5. The battery management system as claimed in claim 1, wherein the first microcontroller on the low-voltage side is connected to a first current sensor, and the second microcontroller on the high-voltage side is connected to a second current sensor that is different than the first current sensor.

6. The battery management system as claimed in claim 1, wherein the first microcontroller on the low-voltage side is configured to evaluate electrical voltages and furthermore has a safety function, and the second microcontroller on the high-voltage side is configured to determine a state of charge.

7. The battery management system as claimed in claim 1, wherein both the first and the second measuring units are in the form of min/max measuring units.

8. The battery management system as claimed in claim 1, further comprising a plurality of cell monitoring units equipped with in each case one of the first voltage measuring units and one of the voltage measuring units and with a microcontroller,
wherein the voltage measuring units of one cell monitoring unit are coupled to common inputs of the cell monitoring unit, and
wherein the microcontroller in the cell monitoring unit is configured to evaluate data from one of the voltage measuring units of the respective cell monitoring unit.

9. A method for monitoring a battery, comprising:
determining a state of charge; and
monitoring the presence of minimum and maximum voltages,
wherein different communication topologies operating independently of one another are used for (i) detecting the voltage values for determining the state of charge, and (ii) detecting the voltage values for monitoring the minimum and maximum voltages,
wherein min/max measuring units are used at least for detecting the voltage values for the monitoring of the minimum and maximum voltage values, the min/max measuring units including:
a plurality of first voltage measuring units, each of the first voltage measuring units assigned to at least one battery module of the battery, and
a plurality of second voltage measuring units, the first or the second voltage measuring units being configured as the min/max measuring units in order to detect a minimum and a maximum voltage value of the battery cells in the battery modules assigned to the respective min/max measuring unit and to reject voltage measured values therebetween.

10. A battery, comprising:
a battery management system including:
a control device having a first microcontroller arranged on a low-voltage side of the control device and a second microcontroller arranged on a high-voltage side of the control device;
a plurality of first voltage measuring units, each of the first voltage measuring units assigned to at least one battery module of the battery;
a first communication link configured to transmit voltage values from the first voltage measuring units to the first microcontroller;
a plurality of second voltage measuring units; and
a second communication link configured to transmit voltage values from the second voltage measuring units to the second microcontroller,
wherein the first or the second voltage measuring units are configured as min/max measuring units in order to detect a minimum and a maximum voltage value of the battery cells in the battery modules assigned to the respective min/max measuring unit and to reject voltage measured values therebetween.

11. The battery as claimed in claim 10, wherein a motor vehicle includes the battery, and wherein the battery to be monitored is connected to a drive system of the motor vehicle.

12. The battery management system as claimed in claim 5, wherein the first current sensor is configured as a Hall sensor, and wherein the second current sensor has a shunt resistor.

* * * * *